United States Patent [19]

Kasahara et al.

[11] 4,443,565
[45] Apr. 17, 1984

[54] THERMOPLASTIC RESIN COMPOSITION CONTAINING METAL FOIL FRAGMENTS AND PROCESS FOR ITS PRODUCTION

[75] Inventors: Kanji Kasahara; Akira Sakamoto, both of Yokkaichi, Japan

[73] Assignee: Mitsubishi Monsanto Chemical Company, Tokyo, Japan

[21] Appl. No.: 463,017

[22] Filed: Feb. 1, 1983

[30] Foreign Application Priority Data

Feb. 26, 1982 [JP] Japan .................................. 57-30051
Aug. 20, 1982 [JP] Japan ................................ 57-144332

[51] Int. Cl.$^3$ .......................... G21K 1/10; G21F 1/10
[52] U.S. Cl. .................................... 523/137; 523/206; 524/780; 524/781; 524/783; 524/784; 524/785; 524/786
[58] Field of Search ............... 524/779, 781, 783, 784, 524/786; 427/214, 216; 428/383, 403, 407; 523/137, 206

[56] References Cited

FOREIGN PATENT DOCUMENTS 57-65754  4/1982  Japan .................................. 523/137

*Primary Examiner*—Joseph L. Schofer
*Assistant Examiner*—J. M. Reddick
*Attorney, Agent, or Firm*—Oblon, Fisher, Spivak, McClelland & Maier

[57] ABSTRACT

A thermoplastic resin composition comprises 100 parts by weight of metal foil fragments, from 1 to 10 parts by weight of a first polymer covering the surfaces of the metal foil fragments and obtained by polymerizing at least one of monomers selected from the group consisting of acrylic acid, methacrylic acid, an alkylacrylate, an aminoalkylacrylate, an alkylmethacrylate and an aminoalkylmethacrylate in the presence of the metal foil fragments, and from 5 to 33 parts by weight of a second polymer obtained by polymerizing a mixture of an aromatic vinyl monomer and a monomer copolymerizable with the atomatic vinyl monomer. Also disclosed is a process for preparing the thermoplastic resin composition containing metal foil fragments.

20 Claims, No Drawings

THERMOPLASTIC RESIN COMPOSITION CONTAINING METAL FOIL FRAGMENTS AND PROCESS FOR ITS PRODUCTION

The present invention relates to a resin composition containing metal foil fragments in a high concentration.

In recent years, electric apparatus and devices equipped with an electromagnetic wave generating source, such as microwave ovens, televisions or microcomputers, have become popular. There are accordingly an increasing number of instances where such apparatus and devices give electromagnetic wave interferences against communication or measuring devices, or they receive electromagnetic wave interferences from outside.

In order to avoid such interferences by electromagnetic waves, it is common to use a metal casing for the assembly of these apparatus or devices. However, the metal casing requires a number of process steps for its shaping or coating. Therefore, it has been desired to develop a thermoplastic resin material which can be readily shaped and which is highly effective to attenuate the electromagnetic waves to pass therethrough.

Thermoplastic resins can easily be shaped. However, if a substantial amount of metal foil fragments such as aluminum or copper foil fragments which are effective for attenuation of the electromagnetic waves, is incorporated to provide an adequate shielding effect against the electromagnetic waves, it would be difficult to adequately knead the mixture by a single shaft extruder as the mixture tends to be hardly processable by the screw of the single shaft extruder. Further, it is difficult to adequately disperse the metal foil fragments in the resin by mere mechanical kneading, and the resin composition thereby obtained does not have adequate strength.

Accordingly, it is an object of the present invention to provide such a resin composition which is highly effective to attenuate electromagnetic waves.

Another object of the present invention is to overcome the abovementioned difficulties in the conventional technique and to provide a resin composition containing metal foil fragments in a high concentration and yet having good dispersibility and adequate strength.

A further object of the present invention is to provide a process for preparing such a resin composition.

The present invention provides a composition comprising 100 parts by weight of metal foil fragments, from 1 to 10 parts by weight of a first polymer covering the surfaces of the metal foil fragments and obtained by polymerizing at least one of monomers selected from the group consisting of acrylic acid, methacrylic acid, an alkylacrylate, an aminoalkylacrylate, an alkylmethacrylate and an aminoalkylmethacrylate in the presence of the metal foil fragments, and from 5 to 33 parts by weight of a second polymer obtained by polymerizing a mixture of an aromatic vinyl monomer and a monomer copolymerizable with the aromatic vinyl monomer.

The present invention also provides a process for preparing a thermoplastic resin composition containing metal foil fragments, which comprises suspension-polymerizing from 1 to 10 parts by weight of at least one of monomers selected from the group consisting of acrylic acid, methacrylic acid, an alkylacrylate, an alkylmethacrylate, an aminoalkylacrylate and an aminoalkylmethacrylate in the presence of 100 parts by weight of metal foil fragments and then adding and suspension-polymerizing from 5 to 33 parts by weight, based on 100 parts by weight of the metal foil fragments, of a mixture of an aromatic vinyl monomer and a monomer copolymerizable with the aromatic vinyl monomer.

Now, the present invention will be described in detail with reference to the preferred embodiments.

The metal foil fragments used in the present invention are preferably made of a metal which is stable and does not fuse or evaporate at a temperature for shaping the thermoplastic resin (usually from 230° to 260° C.) and which has good electric conductivity, such as aluminum, zinc, copper, iron, tin, gold, silver or an alloy thereof.

Further, in order to obtain greater effectiveness for attenuation of electromagnetic waves, it is preferred to use a combination of at least two different types of metal foil fragments. In such a case, a combination of metals belonging to different Groups in the Periodical Table is preferred since it is thereby possible to minimize the specific resistance of the resin composition thereby obtained. For instance, good results will be obtained by a combination of aluminum and zinc or aluminum and tin.

In the case of the combination of aluminum and zinc foil fragments, the mixing ratio is preferably from 3 to 70% by weight of zinc foil fragments, the rests being aluminum foil fragments, more preferably from 5 to 20% by weight of zinc foil fragments, the rest being aluminum foil fragments. When the proportion of zinc foil fragments is less than 3% by weight or more than 70% by weight, no improvements in the reduction of the specific resistance and the attenuation effect against electromagnetic waves are observed as compared with the case where aluminum foil fragments or zinc foil fragments are used alone.

The metal foil fragments preferably have a thickness of from 5 to 50 μm and a quadrilateral shape of 0.5–5 mm×0.5–5 mm, more preferably 1–2 mm×1–2 mm. They may have any other shapes so long as they have a size similar to the above size.

These metal foil fragments are covered on their surfaces with a polymer obtained by polymerizing at least one of monomers selected from the group consisting of acrylic acid, methacrylic acid, an alkylacrylate, an aminoalkylacrylate, an alkylmethacrylate and an aminoalkylmethacrylate. Such a polymer is suitable because it has good adhesion to the metal foil fragments. The amount of the polymer is from 1 to 10 parts by weight per 100 parts by weight of the metal foil fragments. If the amount is less than 1 part by weight, no adequate coating effectiveness will be obtained. On the other hand, if the amount exceeds 10 parts by weight, there will be an excess amount of the polymer which does not attach to the surfaces of the metal foil fragments and which gives an adverse effect to the physical properties of the composition thereby obtained.

The polymer to be used for coating the metal foil fragment may be a homopolymer of one of the abovementioned monomers or copolymer of at least two such monomers. For instance, there may be used a homopolymer of methylmethacrylate or a copolymer of methylmethacrylate with from 10 to 30% by weight of acrylic acid. However, a copolymer of methylmethacrylate with from 30 to 70% by weight of an aminoalkylacrylate or an aminoalkylmethacrylate is particularly preferred since it is superior in the coatability on the metal foil fragments and the compatibility with other resins.

In such a case, the aminoalkyl group in the aminoalkylalkylate or the aminoalkylmethacrylate is preferably a dimethylaminoethyl group (($CH_3$)$_2$N$CH_2CH_2$—). However, other groups such as a diethylaminoethyl group and a dimethylaminopropyl group are also useful as the aminoalkyl group.

As the alkyl group, a straight chain, branched chain or alicyclic alkyl group having from 1 to 10 carbon atoms is used. However, a methyl group or an ethyl group is preferred in view of the physical properties such as tensil strength of the polymer thereby obtained. The mixing ratio of the monomers in a mixture is not restricted to the above-mentioned range. However, if the mixing ratio is in the above-mentioned range, good results are obtainable in the coatability on the metal foil fragment surfaces, the dispersibility and the physical properties.

The metal foil fragments may be coated with the above-mentioned polymer by dipping the metal foil fragments in a solution prepared by dissolving the polymer in a suitable organic solvent. However, it is preferred to suspension-polymerize the above-mentioned monomer or monomer mixture in the presence of the metal foil fragments, whereby the coating can readily be done. When a combination of two different types of metal foil fragments is used, it is preferred preliminarily mix the two types of the metal foil fragments and then to suspension-polymerize the monomer or monomer mixture in the presence of the metal foil fragment mixture.

Then, from 5 to 33 parts by weight, based on 100 parts by weight of the metal foil fragments, of a polymer obtained by polymerizing a mixture of an aromatic vinyl monomer and a monomer copolymerizable with the aromatic vinyl monomer is incorporated so that total amount of the polymers, i.e. this polymer and the polymer covering the surfaces of the metal foil fragments, is brought to from 6 to 43 parts by weight per 100 parts by weight of the metal foil fragments.

If the amount of the polymer obtained by the polymerization of the aromatic vinyl polymer and the monomer copolymerizable therewith, is less than 5 parts by weight, the bulk density of the composition thereby obtained tends to be small, whereby the composition tends to be hardly mixed with e.g. an ABS resin. On the other hand, if the amount exceeds 33 parts by weight, the concentration of the metal foil fragments tends to be insufficient when the composition is mixed with an ABS resin or other thermoplastic resin.

As the aromatic vinyl monomer to be used in the present invention, there may be mentioned styrene, α-methylstyrene, vinyl toluene and a halogenated styrene. As the copolymerizable monomer, acrylonitrile, methacrylonitrile or an alkylester of acrylic acid or methacrylic acid is suitable. The concentration of the copolymerizable monomer in the monomer mixture is preferably from 20 to 50% by weight. If the concentration is outside this range, the composition thereby obtained tends to have poor compatibility with other resins.

In the preparation of the composition of the present invention, it is preferred that the above-mentioned monomers are suspension-polymerized in the presence of the metal foil fragments.

Namely, 100 parts by weight of the metal foil fragments and from 1 to 10 parts by weight of at least one of the monomers selected from the group consisting of acrylic acid, methacrylic acid, an alkylacrylate, an aminoalkylacrylate, an alkylmethacrylate and an aminoalkylmethacrylate are suspended in water and the suspension is suspension-polymerized in accordance with a usual method. As the polymerization initiator, a water soluble initiator such as a persulfate is preferably used to obtain a good coating on the foil surfaces. Upon completion of the polymerization, from 5 to 33 parts by weight of a mixture of the aromatic vinyl monomer and the monomer copolymerizable therewith is added and further suspension-polymerized.

The composition thereby obtained is in the form of pellets in which some tens metal foils are laminated. The composition has a great bulk density and good compatibility with e.g. an ABS resin.

The composition of the present invention can be used by itself. However, it may also be used as a mixture with other resin such as an ABS resin or an AS resin. In such a case, the mixing can be done by a single shaft extruder. The mixture thereby obtained has good physical properties and good electroconductivity. Especially when two types of the metal foil fragments are used in combination, particularly good reduction of the specific resistance and electromagnetic wave attenuation characteristics are obtainable.

Further, the metal foils in the composition are hardly susceptible to peeling even when an outer force is applied.

Now, the present invention will be described in further detail with reference to Examples, Comparative Examples and Application Examples.

EXAMPLE 1

Into a four-necked glass flask having a capacity of 3 liters and equipped with a stirrer, 2.0 kg of demineralized water and 320 g of aluminum foil fragments (1.4×1×0.025 mm, K-102 manufactured by Transmet Company) were introduced and thoroughly stirred. Then, 8 g of methylmethacrylate and 8 g of dimethylaminoethylmethacrylate were added thereto and the flask was flushed with nitrogen gas and heated to 70° C. After the polymerization system reached 70° C., 0.8 g of potassium persulfate was added and the reaction was continued for 1.5 hours. Then, the system was heated to 90° C. and the reaction was continued for 1 hour. Thereafter, while maintaining the temperature of the reaction system at 80° C., 50 g of styrene, 34 g of acrylonitrile, 1 g of terpinolene as a chain transfer agent, 2 g of benzoyl peroxide as an initiator and 0.5 g of azobisisobutylonitrile were added and the polymerization were conducted for 2 hours. After completion of the reaction, the temperature was raised to 90° C. and the removal of the unreacted monomers was conducted for 1 hour while supplying nitrogen gas.

Thereafter, the polymer containing aluminum foil fragments was collected by filtration with use of a metal net of 200 mesh. The polymer thereby obtained had a bulk density of 0.46 g/cm$^3$ (the bulk density of aluminum foil fragments was 0.19 g/cm$^3$). The contents of the aluminum foil fragments was 83.3% by weight and the yield was 95%.

EXAMPLE 2

A composition containing aluminum foil fragments was prepared in the same manner as in Example 1 except that 16 g of methylmethacrylate was used instead of the mixture of methylmethacrylate and dimethylaminoethylmethacrylate.

The bulk density of the composition was 0.35 g/cm³, the contents of the aluminum foil fragments was 84% by weight and the yield was 96.8%.

EXAMPLE 3

A composition containing aluminum foil fragments was prepared in the same manner as in Example 1 except that a mixture of 3.2 g of acrylic acid and 12.8 g of methylmethacrylate was used instead of the mixture of methylmethacrylate and dimethylaminoethylmethacrylate.

The bulk density of the composition was 0.38 g/cm³, the contents of aluminum foil fragments was 90.7% by weight and the yield was 88%.

COMPARATIVE EXAMPLE 1

Into a four-necked flask having a capacity of 3 liters, 2.0 kg of demineralized water and 320 g of aluminum foil fragments (which were the same as used in Example 1) were introduced and throughly stirred to obtain a dispersion. Then, 62.5 g of styrene, 37.5 of acrylonitrile, 1 g of terpinolene, 2 g of benzoylperoxide and 0.5 g of azobisisobutylonitrile were added thereto and the polymerization was conducted at 80° C. for 2 hours. The temperature was then raised to 90° C. and the removal of the unreacted monomers was conducted for 1 hour while supplying nitrogen gas.

The bulk density of the polymer was 0.28 g/cm³ and the yield was 83% However, a great number of polymer particles containing no aluminum foil fragments were present. Further, there remained some aluminum fragments which were not coated with the polymer and which were not laminated.

EXAMPLE 4

Into the same flask as used in Example 1, 2.0 kg of demineralized water and 900 g of copper foil fragments (1.5×1.3×0.035 mm) were introduced and stirred to obtain a dispersion. Then, 10 g of methylmethacrylate and 10 g of dimethylaminomethacrylate were added thereto and the temperature was raised to 70° C. After the temperature reached 70° C., 2 g of potassium persulfate was added and the above monomer mixture was polymerized for 1.5 hours and then the polymerization was conducted at 90° C. for 1 hour. After the polymerization system was cooled to 80° C., 64 g of styrene, 36 g of acrylonitrile, 1 g of terpinolene, 3 g of benzoylperoxide and 2 g of azobisisobutylonitrile were added and the polymerization was conducted for 2 hours.

The composition containing the copper foil fragments was collected by filtration with a metal net of 200 mesh.

The bulk density of the composition thereby obtained was 1.44 g/cm³ (the bulk density of the copper foil fragments per se was 0.95 g/cm³). The content of the copper foil fragments was 91.5% by weight and the yield was 97%.

APPLICATION EXAMPLE 1

The composition obtained by Example 1 was dry-blended with an ABS resin (TFX-455 AB manufactured by Mitsubishi Monsanto Chemical Company) to bring the aluminum foil content to be 40% by weight and the blended mixture was injection-molded. The composition thereby obtained had the following physical properties.

Tensile strength (Breaking point) 365 kg/cm² (measured in accordance with JIS K-6871)

Elongation for breakage 1.7% (measured in accordance with JIS K-6871)

Izod impact strength 6.1 kg.cm/cm (measured in accordance with JIS K-6871)

Specific volume resistance* 3.0 Ω·cm
*measured with a test piece of 1.27×1.27×10 cm.

APPLICATION EXAMPLE 2

The composition obtained by Example 4 was mixed with an ABS resin (TFX-455 AB manufactured by Mitsubishi Monsanto Chemical Company) to bring the copper foil contents to be 70% by weight and the mixture was pelletized by a single shaft extruder. The pellets thereby obtained were molded to obtain test pieces. The specific volume resistance of the test pieces as measured in the same manner as in Application Example 1 was 10² Ω·cm or less.

EXAMPLE 5

Into a four-necked glass flask having a capacity of 3 liters and equipped with a stirrer, 2.0 kg of demineralized water, 280 g of aluminum foil fragments (1.4×1×0.025 mm, K-102 manufactured by Transmet Company) and 40 g of zinc foil fragments (2.0×1×0.020 mm, manufactured by Fukuda Metal Foil Company) were introduced and thoroughly stirred. Then, 8 g of methylmethacrylate and 8 g of dimethylaminoethylmethacrylate were added thereto. The flask was flushed with nitrogen gas and the temperature was raised to 70° C. After the polymerization system reached 70° C., 0.8 g of potassium persulfate was added and reaction was conducted for 1.5 hours. Then, the temperature was raised to 90° C. and reaction was conducted for 1 hour.

Then, while maintaining the temperature of the polymerization system at 70° C., 50 g of styrene, 34 g of acrylonitrile, 1 g of terpinolene as a chain transfer agent, 2 g of benzoyl peroxide as an initiator and 0.5 g of azobisisobutylonitrile were added and the polymerization was conducted for 2 hours. After completion of the reaction, the temperature was raised to 90° C. and the removal of the unreacted monomers was conducted for 1 hour while supplying nitrogen gas.

Thereafter, the polymer containing laminated metal foil fragments was collected by filtration with use of a metal net of 200 mesh.

The bulk density of the polymer thereby obtained was 0.45 g/cm³ and the content of the metal foil fragments was 82.6%.

EXAMPLE 6

A composition containing metal foil fragments was prepared in the same manner as in Example 5 except that the metal foil fragments were replaced by 300 g of aluminum foil fragments and 20 g of zinc foil fragments. The content of the metal foil fragments was 83.5%.

EXAMPLE 7

A composition containing metal foil fragments was prepared in the same manner as in Example 5 except that the metal foil fragments were replaced by 160 g of aluminum foil fragments and 160 g of zinc foil fragments. The content of the metal foil fragments was 82.0%.

EXAMPLE 8

A composition containing metal foil fragments was prepared in the same manner as in Example 5 except that the metal foil fragments were replaced by 280 g of aluminum foil fragments and 40 g of copper foil fragments. The content of the metal foil fragments was 81.6%.

EXAMPLE 9

A composition containing metal foil fragments was prepared in the same manner as in Example 5 except that no aluminum foil fragments were added and 720 g of zinc foil fragments were used. The content of the zinc foil fragments was 91.0%.

EXAMPLE 10

A composition containing metal foil fragments was prepared in the same manner as in Example 5 except that 320 g of copper foil fragments were used as the metal foil fragments. The content of the copper foil fragments was 83.0%.

APPLICATION EXAMPLES 3 TO 9

The compositions obtained by Examples 1 and 5 to 10 were respectively dry-blended with an ABS resin (TFX-455 AB manufactured by Mitsubishi Monsanto Chemical Company) to bring their metal foil content to be 45% by weight and the blended mixtures were respectively pelletized and injection-molded. The physical properties of the respective molded products are shown in Tables 1 and 2.

APPLICATION EXAMPLE 10

The compositions obtained by Examples 1 and 9 were mixed in such a proportion that aluminum foil fragments were 87.5% by weight and the zinc foil fragments were 12.5% by weight, and the mixture was dry-blended and the physical properties of the product was measured in the same manner as in Application Example 3. The results thereby obtained are shown in Table 1.

APPLICATION EXAMPLE 11

87.5% by weight of the aluminum foil fragments and 12.5% by weight of the zinc foil fragments as used in Example 5 were mixed and the mixture was blended with an ABS resin as used in Application Example 3 by a double shaft extruder to bring the metal foil content to be 45% by weight. The results thereby obtained are shown in Tables 1 and 2.

TABLE 1

| Application Examples | Compositions | Metal foil contents (wt. %) | Al wt. % | Zn wt. % | Cu wt. % | Specific resistane (Ω · cm) |
| --- | --- | --- | --- | --- | --- | --- |
| 3 | Example 1 | 45 | 100 | 0 | 0 | 1.5 |
| 4 | Example 6 | 45 | 93.7 | 6.3 | 0 | 0.090 |
| 5 | Example 5 | 45 | 87.5 | 12.5 | 0 | 0.048 |
| 6 | Example 7 | 45 | 50 | 50 | 0 | 0.35 |
| 7 | Example 8 | 45 | 87.5 | 0 | 12.5 | 0.37 |
| 8 | Example 9 | 45 | 0 | 100 | 0 | 13.3 |
| 9 | Example 10 | 45 | 0 | 0 | 100 | 10 or greater |
| 10 | Example 1 + Example 9 | 45 | 87.5 | 12.5 | 0 | 1.7 |
| 11 | Aluminum foil + zinc foil | 45 | 87.5 | 12.5 | 0 | 1.8 |

The specific resistance was obtained by measuring the resistance of a test piece of 1.27×1.27×10 cm between two points thereof at a distance of 10 cm.

TABLE 2

| Application Examples | Attenuation of electromagnetic waves (dB) | | |
| --- | --- | --- | --- |
| Frequency | 10 MHz | 100 MHz | 1 GHz |
| 3 | 24 | 22 | 23 |
| 4 | 54 | 56 | 64 |
| 5 | 64 | 72 | 78 |
| 7 | 43 | 39 | 29 |
| 9 | 23 | 23 | 33 |

The attenuation of electromagnetic waves was measured by placing a disk-shaped test piece having an outer diameter of 90 mm and a thickness of 3.2 mm and provided at its center with a coaxial disk-shaped through-hole having a diameter of 25 mm, in a coaxial transmission tube and measuring the difference between the input and the output.

We claim:

1. A composition comprising (a) 100 parts by weight of metal foil fragments, (b) from 1 to 10 parts by weight of a first polymer covering the surfaces of the metal foil fragments and obtained by first homopolymerizing or copolymerizing with each other at least one of monomers selected from the group consisting of acrylic acid, methacrylic acid, and alkylacrylate, an aminoalkylacrylate, an alkylmethacrylate and an aminoalkylmethacrylate in the presence of the metal foil fragments, and (c) from 5 to 33 parts by weight of a second polymer obtained by subsequently polymerizing a mixture of an aromatic vinyl monomer and a monomer copolymerizable with the aromatic vinyl monomer selected from the group consisting of acrylonitrile, methacrylonitrile, acrylic acid esters and methacrylic acid esters.

2. The composition according to claim 1 wherein said metal foil fragments are made of aluminum, zinc, copper, iron, tin, gold, silver or an alloy thereof.

3. The composition according to claim 1 wherein said metal foil fragments are made of aluminum.

4. The composition according to claim 1 wherein said metal foil fragments are a mixture of from 3 to 70% by weight of zinc foil fragments or copper foil fragments and from 30 to 97% by weight of aluminum foil fragments.

5. The composition according to claim 1 wherein said metal foil fragments are a mixture of from 5 to 20% by weight of zinc foil fragments or copper foil fragments and from 80 to 95% by weight of aluminum foil fragments.

6. The composition according to claim 1 wherein said metal foil fragments have a size of 0.5–5 mm × 0.5–5 mm and a thickness of from 5 to 50 μm.

7. The composition according to claim 6 wherein said metal foil fragments have a size of 1–2 mm×1–2 mm.

8. The composition according to claim 1 wherein said first polymer is a homopolymer of methylmethacrylate or a copolymer of methylmethacrylate with from 10 to 30% by weight of acrylic acid.

9. The composition according to claim 1 wherein said first polymer is a copolymer of methylmethacrylate with from 30 to 70% by weight of an aminoalkylacrylate or an aminoalkylmethacrylate.

10. The composition according to claim 9 wherein the aminoalkyl group in the aminoalkylacrylate or the aminoalkylmethacrylate is a dimethylaminoethyl group, a diethylaminoethyl group or a dimethylaminopropyl group.

11. The composition according to claim 1 wherein the second polymer is a copolymer of an aromatic vinyl monomer with from 20 to 50% by weight of a monomer copolymerizable with the aromatic vinyl monomer.

12. The composition according to claim 1 wherein the aromatic vinyl monomer is styrene, α-methylstyrene, vinyl toluene or a halogenated styrene and the monomer copolymerizable with the aromatic vinyl monomer is acrylonitrile, methacrylonitrile, or an alkyl ester of acrylic acid or methacrylic acid.

13. A process for preparing a thermoplastic resin composition containing metal foil fragments, which comprises first suspension-homopolymerizing or copolymerizing with each other from 1 to 10 parts by weight of at least one of monomers selected from the group consisting of acrylic acid, methacrylic acid, an alkylacrylate, an alkylmethacrylate, an aminoalkylacrylate and an aminoalkylmethacrylate in the presence of 100 parts by weight of metal foil fragments and then adding and suspension-polymerizing from 5 to 33 parts by weight, based on 100 parts by weight of the metal foil fragments, of a mixture of an aromatic vinyl monomer and a monomer copolymerizable with the aromatic vinyl monomer selected from the group consisting of acrylonitrile, methacrylonitrile, acrylic acid esters and methacrylic acid esters.

14. The process according to claim 13 wherein said metal foil fragments are made of aluminum, zinc, copper, iron, tin, gold, silver or an alloy thereof.

15. The process according to claim 13 wherein said metal foil fragments are a mixture of from 3 to 70% by weight of zinc foil fragments or copper foil fragments and from 30 to 97% by weight of aluminum foil fragments.

16. The process according to claim 13 wherein said metal foil fragments have a size of 0.5–5 mm×0.5–5 mm and a thickness of from 5 to 50 μm.

17. The process according to claim 13 wherein said first polymer is a homopolymer of methylmethacrylate or a copolymer of methylmethacrylate with from 10 to 30% by weight of acrylic acid.

18. The process according to claim 13 wherein said first polymer is a copolymer of methylmethacrylate with from 30 to 70% by weight of an aminoalkylacrylate or an aminoalkylmethacrylate.

19. The process according to claim 13 wherein said second polymer is a copolymer of an aromatic vinyl monomer with from 20 to 50% by weight of a monomer copolymerizable with the aromatic vinyl monomer.

20. The process according to claim 13 wherein the aromatic vinyl monomer is styrene, α-methylstyrene, vinyl toluene or a halogenated styrene and the monomer copolymerizable with the aromatic vinyl monomer is acrylonitrile, methacrylonitrile, or an alkyl ester of acrylic acid or methacrylic acid.

* * * * *